United States Patent [19]
Harrington et al.

[11] 3,955,137
[45] May 4, 1976

[54] ADJUSTABLE FREQUENCY SCANNING SIGNAL PROCESSOR

[75] Inventors: John B. Harrington, Los Alamitos; Michael Waldner, Woodland Hills, both of Calif.

[73] Assignee: Hughes Aircraft Company, Culver City, Calif.

[22] Filed: Aug. 2, 1974

[21] Appl. No.: 494,126

[52] U.S. Cl. ............................. 324/80; 324/77 B; 324/79 R
[51] Int. Cl.² ...................................... G01R 23/00
[58] Field of Search ............... 324/80, 77 A, 77 B, 324/77 C, 77 CS, 77 R

[56] References Cited
UNITED STATES PATENTS

| | | | |
|---|---|---|---|
| 3,283,264 | 11/1966 | Papadakis | 324/80 |
| 3,548,306 | 12/1970 | Whitehouse | 324/80 |

Primary Examiner—Alfred E. Smith
Assistant Examiner—Michael J. Tokar
Attorney, Agent, or Firm—W. H. MacAllister; Lawrence V. Link, Jr.

[57] ABSTRACT

A compressive or "microscan" signal processor adapted for the simultaneous measurement of multifrequency signal components which encompass a broad frequency spectrum. In accordance with one embodiment of the invention, the applied signals are processed through a mixer which is driven by a linear frequency versus time waveform sweep signal. The output from the mixer is applied to one input port of a nonlinear correlator, and a second input port of the correlator is supplied with a linear frequency versus time waveform signal whose slope is opposite from that of the sweep signal applied to the mixer. The output signal from the correlator comprises a series of pulses which are displaced in time as a function of the frequency of the corresponding portions of the applied signals, and whose amplitudes are representative of the relative energy distribution of the applied signals.

10 Claims, 9 Drawing Figures

ADJUSTABLE FREQUENCY SCANNING SIGNAL PROCESSOR

BACKGROUND OF THE INVENTION

This invention relates generally to signal processors of the type wherein signal components which encompass a broad frequency spectrum can be simultaneously analyzed.

Compressive signal processors provide the same general function as do more conventional spectrum analyzers except that they operate at a much faster rate. For example, a compressive processor can analyze a 100 MHz spectrum to a frequency resolution of 140 KHz within 20 microseconds. By comparison a standard spectrum analyzer would require 10,000 microseconds to accomplish this task.

Prior art compressive processors are described in the article by Warren White entitled "Rapid Frequency Scan" in the February 1960 edition of the Proceedings of the IRE, at page 4A; and in the article by R. L. Goodwin, and F. J. Mueller entitled "A High Sensitivity Parametric Receiver Using Pulse Compression Techniques" presented at the IRE Professional Group on Military Electronics Symposium held in Los Angeles, Calif., February 1962.

One such previous technique for the design of compressive processors involves processing the applied signals through a mixer which also responds to a linear frequency versus time waveform type signal that is provided by a sweeping local oscillator circuit. The output signal from the mixer is processed through a linear FM (frequency modulation) type dispersive delay line. The linear frequency modulation on the output signal from the mixer is removed by the dispersive delay line which has a linear frequency versus time transfer characteristic with a slope equal in magnitude but opposite in polarity from the slope of the output signal of the sweeping local oscillator. The output signal from the dispersive delay line is comprised of a series of pulses which are displaced in time as a function of the frequency of the corresponding portions of the applied signals and whose amplitudes are representative of the relative energy content of the applied signals.

Although the above described dispersive delay line type of compressive processor is most satisfactory for many applications, the processor's scanning rate is limited to a single value which is set by the characteristics of the dispersive delay line; and for this type of processor to operate at multiple scan rates it must incorporate as many dispersive delay lines as there are scanning rates. The just mentioned limitation is particularly restrictive, for example, in applications which involve a large frequency range which must be rapidly scanned to monitor for signals having time durations from one microsecond to CW (continuous wave); and wherein once signals have been detected using the fast scan rate, different scans at slower rates and reduced frequency coverage are needed to resolve signals of multiple contiguous frequencies.

SUMMARY OF THE INVENTION

A primary object of the subject invention is to provide an improved signal processor adapted to rapidly and simultaneously analyze signals comprised of energy distributed over a broad frequency spectrum.

Another object of the invention is to provide an improved compressive processor which allows the scan rate, frequency coverage and frequency resolution to be readily and continuously adjusted.

In accordance with one embodiment of the invention, applied signals are processed through a mixer which also responds to a linearly frequency versus time waveform signals applied from a "sweeping local" oscillator. The output signal from the mixer is applied to one input port of a nonlinear correlator and a second input port of the correlator is supplied with a linear frequency versus time waveform signal having an opposite slope to that of the sweep signal provided to the mixer.

In operation of the invention, the processor is "scanned" by means of the linear frequency versus time signal applied to the mixer; and this type of processing applies a linear frequency modulation to the output signal from the mixer. The nonlinear correlator responds to this frequency modulation so that the output signal from the correlator comprises a series of pulses which are displaced in time as a function of the frequency of the corresponding portions of the applied signal, and whose amplitudes are representative of the relative energy content at the various frequencies.

In accordance with the subject invention, the nonlinear correlator may comprise an acoustic surface wave device of the type wherein interdigital surface wave transducers are located at opposite ends of the polished surface of a piezoelectric substrate. Between the transducers a conductive film is disposed which may be either a continuous surface referenced to a ground plane on the underside of the substrate or an interdigital structure of optimum spacing. In the compressive processor of the invention, due to the inversion of one of the linear FM input signals to the acoustic surface wave device relative to the other input signal thereto, the surface wave device functions as a correlator over the time duration determined by the length of the center region of the acoustic surface wave device. The two input signals applied to the surface wave device are of sufficient magnitude as to cause the device to operate in the nonlinear region of its response characteristics.

Compressive processors in accordance with the invention are readily adapted for measuring and/or monitoring any electromagnetic environment by means of controlling a single sweep signal. Hence the subject's invention is a substantial improvement over prior compressive processor techniques which require a different linear FM dispersive delay line for each scan rate.

BRIEF DESCRIPTION OF THE DRAWINGS

The novel features of this invention, as well as the invention itself, will be best understood from the accompanying description taken in connection with the accompanying drawings in which like reference characters refer to like parts and in which.

DESCRIPTION OF THE PREFERRED EMBODIMENTS

Figure 1:
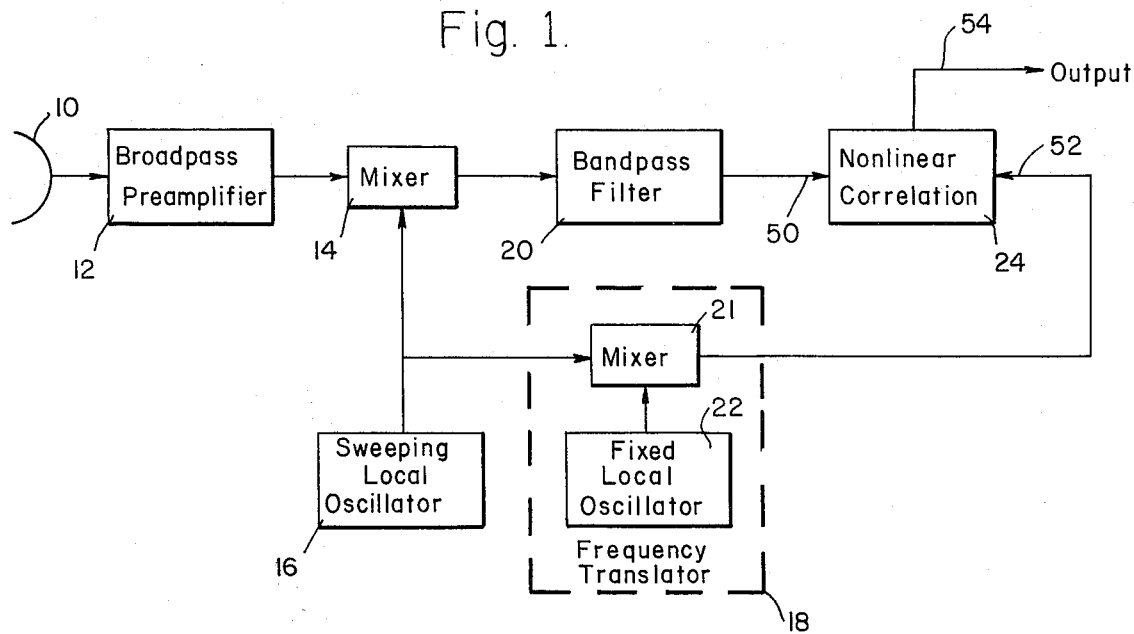
FIG. 1 is a block diagram of one embodiment of a compressive signal processor in accordance with the subject invention.

Referring first to FIG. 1, the embodiment of the invention thereshown is that of a compressive receiver processor which includes an antenna 10, a broadband preamplifier unit 12, and a mixer 14. A "sweeping local oscillator" 16 supplies a linear frequency versus time waveform signal to mixer 14 and to a frequency translator unit 18. Frequency translator 18 includes a mixer 20 and a fixed local oscillator 22.

The output signal from mixer 14 is processed through a bandpass filter 20 and than applied to one input port of a nonlinear correlator 24. The output signal from frequency translator 18 is applied to the other input port of correlator 24. The output signal from correlator 24 may be applied to a utilization device (not shown) such as a display unit or a computer, for example.

Figure 5:
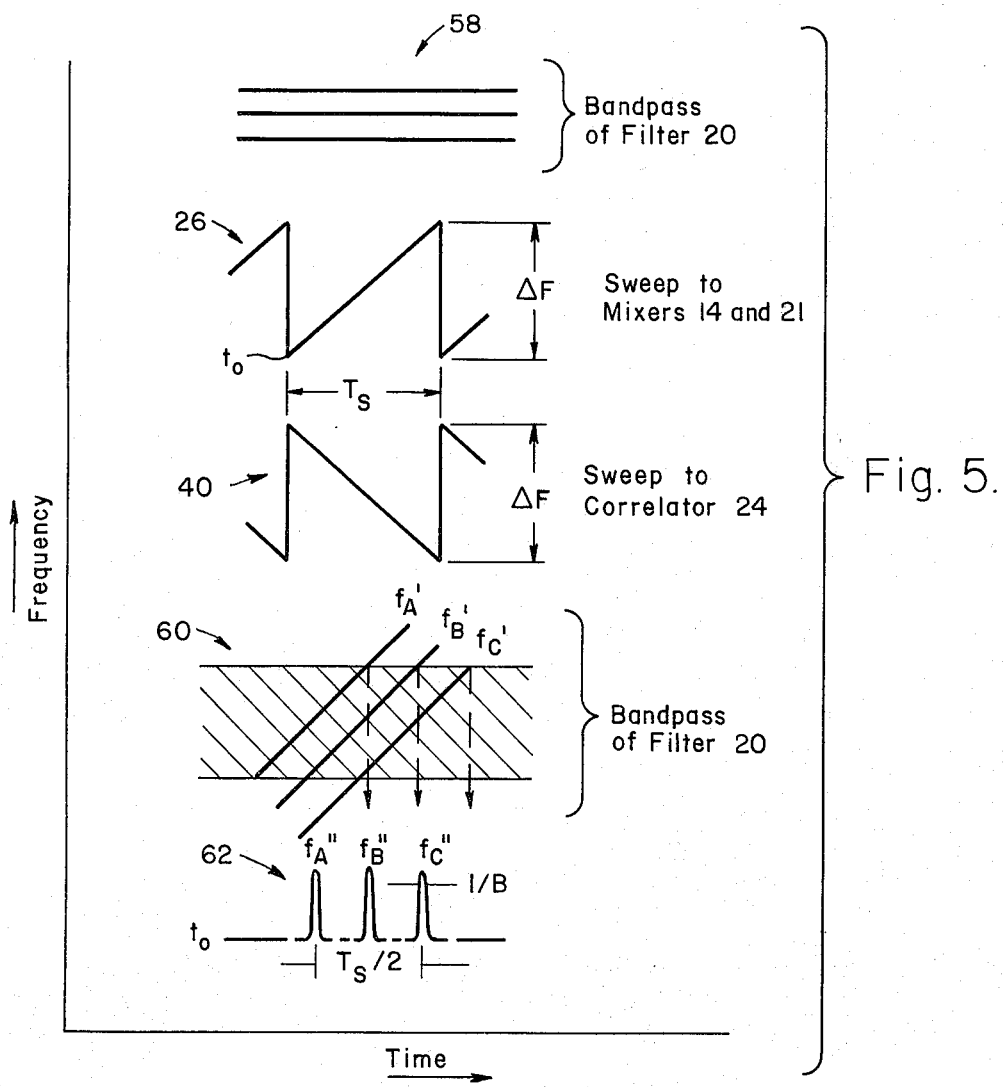
FIGS. 5 through 9 are diagrams of waveforms that are useful for explaining the operation of the subject invention.

Sweeping local oscillator 16 produces a linear frequency versus time waveform which covers a frequency band ΔF in a time period Ts (see waveform 26 in FIG. 5). The sweep 26 is repetitive and the front portion of the receiver is sensitive to different frequencies at different times. The scan rate of sweep 26 is preferably chosen to be sufficiently fast as to allow the interception of pulsed signals of some minimum preselected duration. It is noted that the time interval during each local oscillator sweep in which a signal is within the processing bandwidth of the receiver determines the attainable frequency resolution. Normally the bandwidths of the various elements of the receiver are selected such that the passband of filter 20 establishes the instantaneous bandwidth of receiver.

Figure 3:
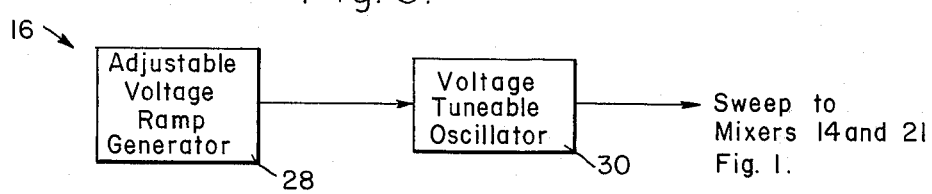

Sweeping local oscillator 16 may be either of an active or a passive configuration. The active configuration is shown in FIG. 3 as comprising an adjustable voltage ramp generator 28 and a voltage tunable oscillator 30. The voltage ramp signal produced by generator 28 is controllable as to its slope and duration. Voltage tunable oscillator 30 converts the voltage versus time ramp waveform applied thereto from ramp generator 28 into frequency versus time waveform 26 (see FIG. 5).

Figure 4:
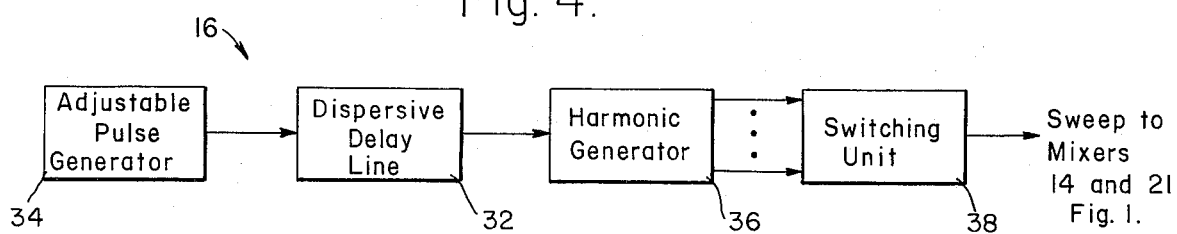
FIGS. 3 and 4 are block diagrams of an active and a passive configuration, respectively, of sweeping local oscillator units suitable for incorporation into the embodiment of FIG. 1.

For applications requiring better sweep linearity than can conveniently be obtained from the active configuration shown in FIG. 3, the passive approach depicted in FIG. 4 is recommended. In the embodiment of FIG. 4, a linear FM dispersive delay line 32 is driven by a wide bandwidth narrow pulse from generator 34 and the output signal from dispersive delay line 32 is applied to a harmonic generator 36. Each output harmonic signal from generator 36 has a frequency versus time slope that is a multiple of the master sweep from dispersive delay line 32.

Linear dispersive delay lines are devices which have propagation characteristics such that the time for signals to be processed therethrough is a linear function of the frequency of the propagating signal; and such devices are well known in the art. For example, dispersive delay lines are considered in the article "The Theory and Design of Chirp Radars" in the Bell System Technical Journal, Vol. 34, July 1960, at pages 745 through 808; and in the text by C. E. Cook and M. Bernfeld entitled "Radar Signals An Introduction to Theory and Application" published by Academic Press of New York and London, at pages 173 through 225, and in U.S. Pat. No. 3,771,062.

In the embodiment of FIG. 4, the duration of the sweep signal is a function of the width of the pulse applied from the adjustable pulse generator 34; and the slope of the sweep signal is determined by the selection of the output signal from harmonic generator 36 by means of switching unit 38.

As shown in FIG. 1, the sweep signal from sweeping local oscillator 16 is applied in parallel to both mixer 14 and frequency translator unit 18. Within the frequency translator unit the just mentioned sweep signal is mixed with a CW signal from local oscillator 22 so as to provide a sweep signal having the opposite frequency versus time slope (see waveform 40 of FIG. 5). The output signal from frequency translator 18 is applied to input 52 of nonlinear correlator 24.

Nonlinear correlator 24 may be an acoustic surface wave device, for example. Such device is described in the articles "Convolution and Correlation in Real Time With Nonlinear Acoustics" published in Applied Physics Letters, Vol. 16, June 1970, at page 494; and "Broadband Surface Wave Nonlinear Convolution Filters" published in paper F-10 of the IEEE Ultrasonics Symposium, held in Miami, Fla., on Dec. 6, 1971.

Figure 2:
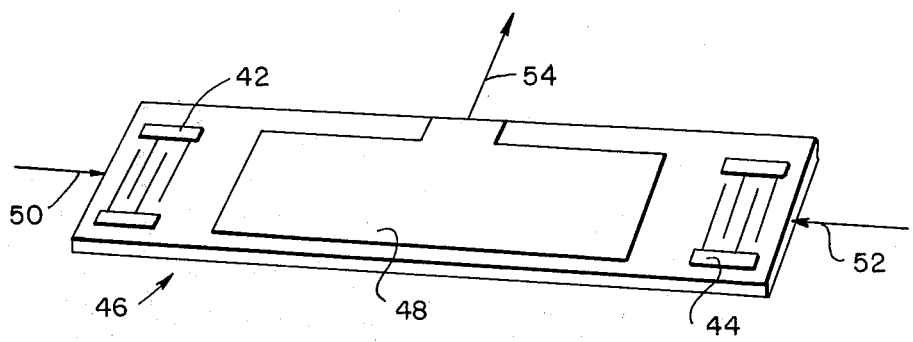
FIG. 2 is a plan view of an acoustic surface wave device which is suitable for use as the nonlinear correlator in the processor of FIG. 1.

A simplified sketch of a nonlinear acoustic surface wave correlator suitable for use in the receiver of FIG. 1 is shown in FIG. 2. Referring momentarily to FIG. 2, the correlator there shown comprises conventional interdigital surface wave transducers 42 and 44 located at opposite ends of the polished surface of a piezoelectric substrate 46. Between transducers 42 and 44 is a conducting film 48 which may be, for example, either a continuous surface referenced to a ground plane (not shown) on the underside of substrate 46 or an interdigital structure of optimum spacing. If a signal $F(t)e^{j\phi_1(t)}$ is applied to a left input terminal 50 and another signal $G(t)e^{j\phi_2(t)}$ is applied to a right input terminal 52, the resultant signal at an output terminal 54 is the convolution of the two signals, i.e. $H(t)e^{j[\phi_1(t) + \phi_2(t)]}$. The envelope of the output signal is approximately $H(t) = \int F(\tau)G(2t-\tau)d\tau$. Where $\tau$ designates a preselected fixed time delay value. Hence, due to the time inversion of one of the signals applied to terminals 50 and 52, the device of FIG. 2 becomes a correlator over the time duration defined by the length of center region 48. It is noted that the two input signals are sufficiently strong to cause correlator 24 to operate in its nonlinear region.

Figure 8:
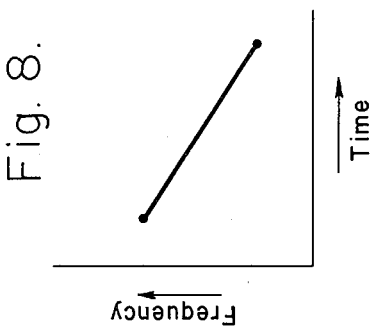
Figure 7:
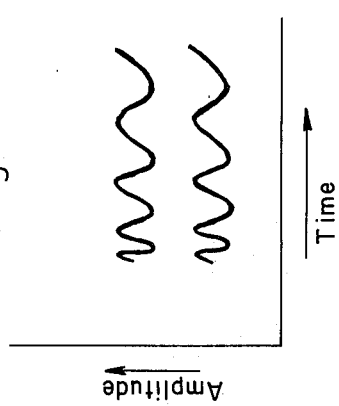
Figure 9:
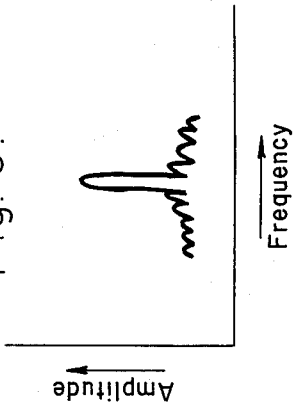
Figure 6:
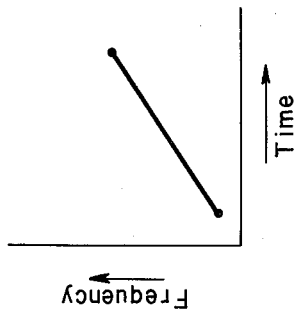

Operation of correlator 24 may be more fully understood by referring momentarily to FIGS. 6 through 9 as well as to FIG. 2. For the situation where a frequency modulated signal having the frequency versus time characteristic depicted by the waveform of FIG. 6 is applied to the input terminal 50 of correlator 24 and a reference signal having the characteristics depicted in FIG. 8 is applied to terminal 52, the amplitude versus time characteristic of these two applied signals in center region 48 of the correlator are as shown in FIG. 7 and the correlated output signal at terminal 54 is depicted in FIG. 9.

To summarize the operation of the receiver of FIG. 1, reference is now primarily directed to FIGS. 1 and 5. The received signals intercepted by antenna 10 are amplified within preamplifier unit 12 and then applied to mixer 14. The output signal from sweeping local oscillator 16 is applied to the second input terminal of mixer 14. This local oscillator sweep signal is shown in waveform 26 of FIG. 5 as a repetitive signal which linearly increases in frequency as a function of time during each scanning time period $T_S$. As a result of the sweeping local oscillator signal, a constant frequency received signal (CW) applied to mixer 14 from preamplifier 12 is converted to a linear FM signal at the mixer's output. For example, if CW signals $f_A, f_B, f_C$ (see waveform 58 of FIG. 5) are applied to mixer 14, the linear FM signals $f_A', f_B',$ and $f_C'$, respectively, (see waveform 60 of FIG. 5) are produced at the output of the mixer.

In waveform 60 the passband of filter 20 is shown by the hatched area as about one-half of the excursion of the local oscillator sweep signal. In the interest of simplicity of explanation, it is here assumed that the bandwidth of the other elements of the receiver are sufficiently large compared to the bandwidth of filter 20 that the bandwidth of the entire receiver may be considered to approximate that of filter 20. It is noted that longer sweeps of the local oscillator signal at the same scanning rate increases the receiver's processing bandwidth (the frequency coverage of the system) at the expense of a lower probability of intercepting pulses. For example, a pulsed signal will not be processed if it occurs during the portion of the local oscillator sweep which produces an output from mixer 14 that is outside of filter's 20 passband.

The frequency modulated signals from mixer 14 are applied through filter 20 to input port 50 of correlator 24; and as was described previously, the other input port 52 is driven with a linear FM signal that has an equal and opposite frequency versus time slope (see waveform 40 of FIG. 5). As explained relative to FIGS. 6 through 9, the output signal from correlator 24 is the convolution of the applied input signals at ports 50 and 52. For the example of the CW received signals $f_A, f_B,$ and $f_C$ the output signals $f_A'', f_B'', f_C''$ are shown in waveform 62 of FIG. 5.

The operation of correlator 24 may be thought of as the "time compression" of the modulated signal from mixer 14 so as to produce a narrow pulse for each frequency component in the received data and with the time position of each output pulse (see waveform 62) corresponding to the frequency of the originating received signal. For example considering waveform 60, the correlator can only "compress" signals which pass through filter 20, i.e. which intercept the hatched area of that figure. Hence the signals $f_A', f_B',$ and $f_C'$ which produce the compressed output pulses shown in waveforms 62 start at different times with respect to the start of the sweep waveform 26 of the sweeping local oscillator 16. In the embodiment of FIG. 1, the higher the frequency of the signal component the larger the time displacement of the output pulse from the start of the local oscillator sweep waveform. If the bandpass of filter 20 is defined as B and if the sweeping local oscillator signal covers the frequency range $\Delta F$ in the time interval $T_S$, then the frequency resolution of the receiver is approximately $(\Delta F/B)(1/T_S)$. As used herein the term frequency resolution means the frequency interval between received CW signals which produce output pulses that can be distinguished as separate pulses in the output waveforms (see waveform 62 of FIG. 5).

Thus having described a new and improved processor adapted for rapidly and simultaneously analyzing signals comprised of energy distributed over a broad frequency spectrum and which allows a single continuous adjustment of the processor's scan rate, frequency coverage, and frequency resolution, what is claimed is:

1. A signal processor adapted for producing output signals indicative of the relative frequency distribution of the energy contained in applied signals, said processor comprising:
    first sweep generator means for producing a first sweep signal which linearly varies in frequency as a function of time;
    second sweep generator means for producing a second sweep signal which varies linearly in frequency as a function of time and whose frequency versus time slope is opposite from the frequency versus time slope of said first sweep signal;
    a signal mixer having a first input circuit adapted to receive said applied signals, a second input circuit coupled to receive said first sweep signal, and an output circuit; and
    a nonlinear correlator having a first input port coupled to said signal mixer's output circuit, a second input port coupled to receive said second sweep signal and an output port; whereby
    the output signal from said nonlinear correlator is indicative of the relative frequency distribution of the energy contained in the applied signals.

2. The signal processor of claim 1 wherein said nonlinear correlator is an acoustic surface wave correlator and wherein the mixer's output signal and the second sweep signal are of sufficient magnitude to cause said acoustic surface wave correlator to operate in a nonlinear region of its response characteristic.

3. The signal processor of claim 2 wherein said acoustic surface wave correlator comprises: a piezoelectric substrate; first and second interdigital surface wave transducers disposed at opposite ends of said substrate; a conductive film disposed between said transducers; first and second input ports coupled to said first and second transducers, respectively; and an output port coupled to said conductive film.

4. The signal processor of claim 1 wherein said first sweep generator means comprises: an adjustable voltage ramp generator; and a voltage tunable oscillator having an input circuit coupled to receive the output signal from said voltage ramp generator and an output circuit at which said first sweep signal is provided.

5. The signal processor of claim 1 wherein said first sweep generator means comprises: an adjustable pulse generator; a dispersive delay line having an input circuit coupled to the output circuit of said adjustable pulse generator; a harmonic generator having an input circuit coupled to the output of said dispersive delay line; and a switching unit having an input circuit coupled to the output of said harmonic generator and having an output circuit at which said first sweep signal is provided.

6. The signal processor of claim 1 wherein said second sweep generator means includes an oscillator unit; and a second signal mixer having a first input circuit coupled to receive the first sweep signal, a second input circuit coupled to receive the output signal from said oscillator unit, and an output circuit at which said second sweep signal is provided.

7. A signal processor adapted for analysis of the frequency distribution of the energy within an applied signal, said processor comprising:
    first sweep generator means for producing a first sweep signal which linearly varies in frequency as a function of time;

second sweep generator means for mixing said first sweep signal with a fixed frequency signal so as to produce a second sweep signal which varies linearly in frequency as a function of time and whose frequency versus time slope is opposite from the frequency versus time slope of said first sweep signal;

a signal mixer having a first input circuit adapted to receive said applied signals, a second input circuit coupled to receive said first sweep signal, and an output circuit; and a nonlinear acoustic surface wave correlator having a first input port coupled to said signal mixer's output circuit, a second input port coupled to receive said second sweep signal and an output port; whereby the output signal from said correlator comprises pulses whose time separation is indicative of relative frequency and whose amplitude is indicative of relative energy content.

8. The signal processor of claim 7 wherein said nonlinear acoustic surface wave correlator comprises: a piezoelectric substrate; first and second interdigital surface wave transducers disposed at opposite ends of said substrate; a conductive film disposed between said transducers; first and second input ports coupled to said first and second transducers, respectively; and an output port coupled to said conductive film.

9. The signal processor of claim 7 wherein said first sweep generator means comprises: an adjustable voltage ramp generator; and a voltage tunable oscillator having an input circuit coupled to receive the output signal from said voltage ramp generator and an output circuit at which said first sweep signal is provided.

10. The signal processor of claim 7 wherein said first sweep generator means comprises: an adjustable pulse generator; a dispersive delay line having an input circuit coupled to the output circuit of said adjustable pulse generator; a harmonic generator having an input circuit coupled to the output of said dispersive delay line; and a switching unit having an input circuit coupled to the output of said harmonic generator and having an output circuit at which said first sweep signal is provided.

\* \* \* \* \*